(12) United States Patent
Lim

(10) Patent No.: US 7,839,464 B2
(45) Date of Patent: Nov. 23, 2010

(54) DISPLAY APPARATUS WITH COOLING MEANS

(75) Inventor: Ji Hong Lim, Seoul (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1019 days.

(21) Appl. No.: 11/384,099

(22) Filed: Mar. 17, 2006

(65) Prior Publication Data

US 2006/0227077 A1     Oct. 12, 2006

(30) Foreign Application Priority Data

Apr. 7, 2005      (KR) ...................... 10-2005-0029184

(51) Int. Cl.
   *G02F 1/1333*     (2006.01)
(52) U.S. Cl. ........................ 349/58; 362/633
(58) Field of Classification Search .................. 349/58, 349/151, 72, 40, 69, 71; 362/632–634
   See application file for complete search history.

(56) References Cited

U.S. PATENT DOCUMENTS

| | | | | |
|---|---|---|---|---|
| 5,659,376 | A | * | 8/1997 | Uehara et al. .................. 349/58 |
| 5,835,179 | A | * | 11/1998 | Yamanaka ................... 349/161 |
| 5,869,919 | A | * | 2/1999 | Sato et al. ...................... 313/17 |
| 6,392,724 | B2 | * | 5/2002 | An et al. ........................ 349/58 |
| 6,541,900 | B1 | * | 4/2003 | Ando .......................... 313/292 |
| 6,737,790 | B2 | * | 5/2004 | Seki ............................. 313/47 |
| 6,950,308 | B2 | * | 9/2005 | Saitoh et al. ................. 361/704 |

FOREIGN PATENT DOCUMENTS

| | | |
|---|---|---|
| JP | 2000-090840 | 3/2000 |
| JP | 2000-122565 | 4/2000 |
| JP | 2001-266760 | 9/2001 |
| JP | 2001-312211 | 11/2001 |
| JP | 2001-332886 | 11/2001 |
| JP | 2003-216054 | 7/2003 |
| JP | 2004-086171 | 3/2004 |
| JP | 2004-206076 | 7/2004 |
| JP | 2005-004971 | 1/2005 |
| JP | 2005-070662 | 3/2005 |
| KR | 10-0434524 | 5/2004 |

OTHER PUBLICATIONS

Korean Patent Abstracts, Publication No. 100434524 B1; Publication Date: May 25, 2004; in the name of Hong.

Japanese Office action dated Aug. 10, 2010, for corresponding Japanese Patent application 2005-236082, noting listed references in this IDS.

* cited by examiner

*Primary Examiner*—Thoi V Duong
(74) *Attorney, Agent, or Firm*—Christie, Parker & Hale, LLP

(57) ABSTRACT

A display apparatus has a cooling means, including a display panel having a first substrate and a second substrate which are spaced from each other. A chassis member is placed at the rear surface region of the display apparatus and is formed to surround sides and a front edge region of the display panel. With this configuration, the display apparatus with a cooling means effectively discharges heat from the display panel, thereby cooling the entire display panel.

5 Claims, 5 Drawing Sheets

DISPLAY APPARATUS WITH COOLING MEANS

CROSS-REFERENCE TO RELATED APPLICATIONS

This application claims the benefit of Korean Patent Application No. 2005-29184, filed on Apr. 7, 2005, in the Korean Intellectual Property Office, the disclosure of which is incorporated herein by reference.

BACKGROUND

1. Field of the Invention

The present invention relates to a display apparatus with a cooling means, for effectively discharging heat from an entire display panel.

2. Discussion of Related Art

In a typical flat panel display (FPD), a container is formed by sealing two substrates with a lateral wall standing therebetween, and having materials arranged within the container that allow for a desired image to be displayed. As multimedia have recently been developed, the importance of flat panel displays increases. Accordingly, various flat panel displays such as liquid crystal displays (LCD), plasma display panels (PDP), electron emission displays, etc. have been developed and put to practical use.

Particularly, an electron emission display employs an electron beam allowing a fluorescent material to emit light, similar to a cathode ray tube (CRT). Thus, the electron emission display has the desirable qualities of both a CRT and a flat panel display, which consumes low power and displays an image without contortion. Further, the electron emission display is expected to be a next generation display because it has a fast response time, high brightness, fine pitch, thinness, etc.

In general, an electron emission device uses a hot cathode or a cold cathode as an electron source. Examples of electron emission devices using a cold cathode are a field emitter array (FEA) type, a surface conduction emitter (SCE) type, a metal-insulator-metal (MIM) type, a metal-insulator-semiconductor (MIS) type, and a ballistic electron surface emitting (BSE) type.

The electron emission display has a triode structure of a cathode electrode, an anode electrode and a gate electrode. In more detail, the cathode electrode generally used as a scan electrode is formed on a substrate. Additionally, an insulating layer formed with a hole and the gate electrode generally used as a data electrode are formed on the cathode electrode in sequence. An emitter is formed as the electron source within the hole to contact the cathode electrode.

In an electron emission display with this configuration, electrons emitted from the emitter are accelerated by a voltage applied between the cathode electrode and the anode electrode and collide with red, green and blue (RGB) fluorescent materials provided on the anode electrode, so that the fluorescent materials emit light, thereby displaying a predetermined image at a front region of the display panel.

FIG. 1 is an exploded perspective view of a conventional display apparatus, and FIG. 2 is a cross-sectional view taken along line I-I' of a non-exploded version of FIG. 1. Referring to FIGS. 1 and 2, the conventional display apparatus 100 includes a display panel 120 having a first substrate 121 and a second substrate 122 which are spaced from each other. The display apparatus 100 also includes a heat discharging plate 130, a back cover 110 covering the heat discharging plate 130 and sides of the display panel 120, and a front cover 140 covering a front edge region of the display panel 120, the front cover being coupled to the sides of the back cover 110.

The display panel 120 includes the first substrate 121 from which electrons are emitted, and the second substrate 122 on which a predetermined image is displayed. The first substrate 121 and the second substrate 122 are spaced from each other, maintaining a vacuum state. A supporter 123 is provided between the first substrate 121 and the second substrate 122 to support the first and second substrates 121 and 122 and maintain the vacuum state.

The display panel 120 is connected with a data driver 124a to supply a data signal and a scan driver 124b to supply a scan signal. When supplying the signals to the display panel 120, the data and scan drivers 124a and 124b generate high temperatures due to the large amount of current, increasing the temperature of the entire display panel 120. The heat generated from the display panel 120 can be discharged through the heat discharging plate 130 provided in a rear of the display panel 120.

However, in the conventional display apparatus, the heat discharging plate is in contact with a limited portion of the display panel so that it does not optimally discharge heat from the whole display panel.

The above information disclosed in this Background section is only for enhancement of understanding of the background of the invention, and therefore it may contain information that does not form the prior art that is already known in this country to a person of ordinary skill in the art.

SUMMARY OF THE INVENTION

A display apparatus is provided having a cooling means including a display panel having a first substrate at a rear region of the display panel and a second substrate at a front region of the display panel, the first substrate and the second substrate being spaced from each other. A chassis member is placed at a rear surface region of the display apparatus and bent to surround lateral sides and a front edge region of the display panel.

In accordance with another aspect of the present invention a display apparatus is provided with cooling means including a display panel having a first substrate and a second substrate which are spaced apart each other at a predetermined distance; a chassis member placed at a rear surface region of the display apparatus, and a conductive member placed in lateral sides and a front edge region of the display panel and a back edge region of the chassis member.

With this configuration, the present invention provides a display apparatus with a cooling means for effectively discharging heat from a display panel, thereby cooling the entire display panel.

DETAILED DESCRIPTION

Figure 1:
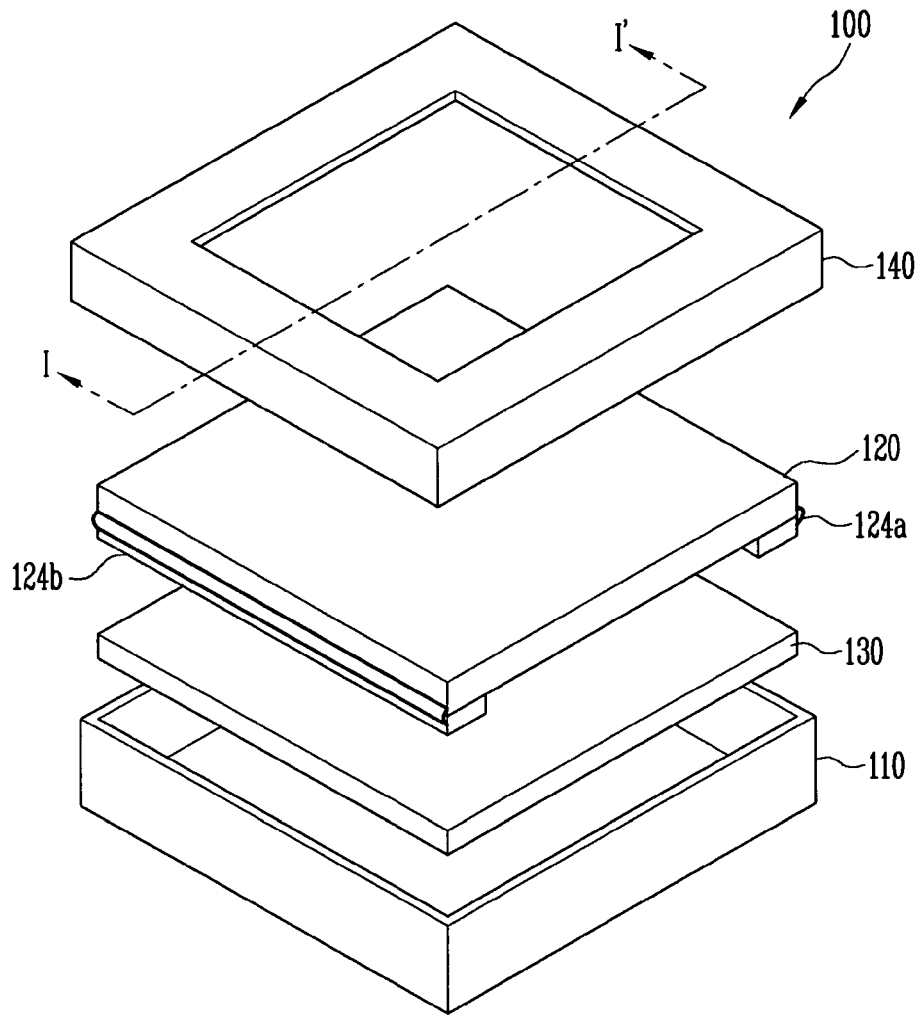
FIG. 1 is an exploded perspective view of a conventional display apparatus.
Figure 2:
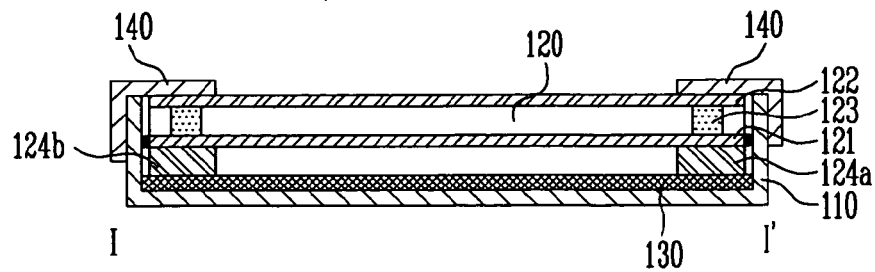
FIG. 2 is a cross-sectional view taken along line I-I' of FIG. 1.
Figure 3:
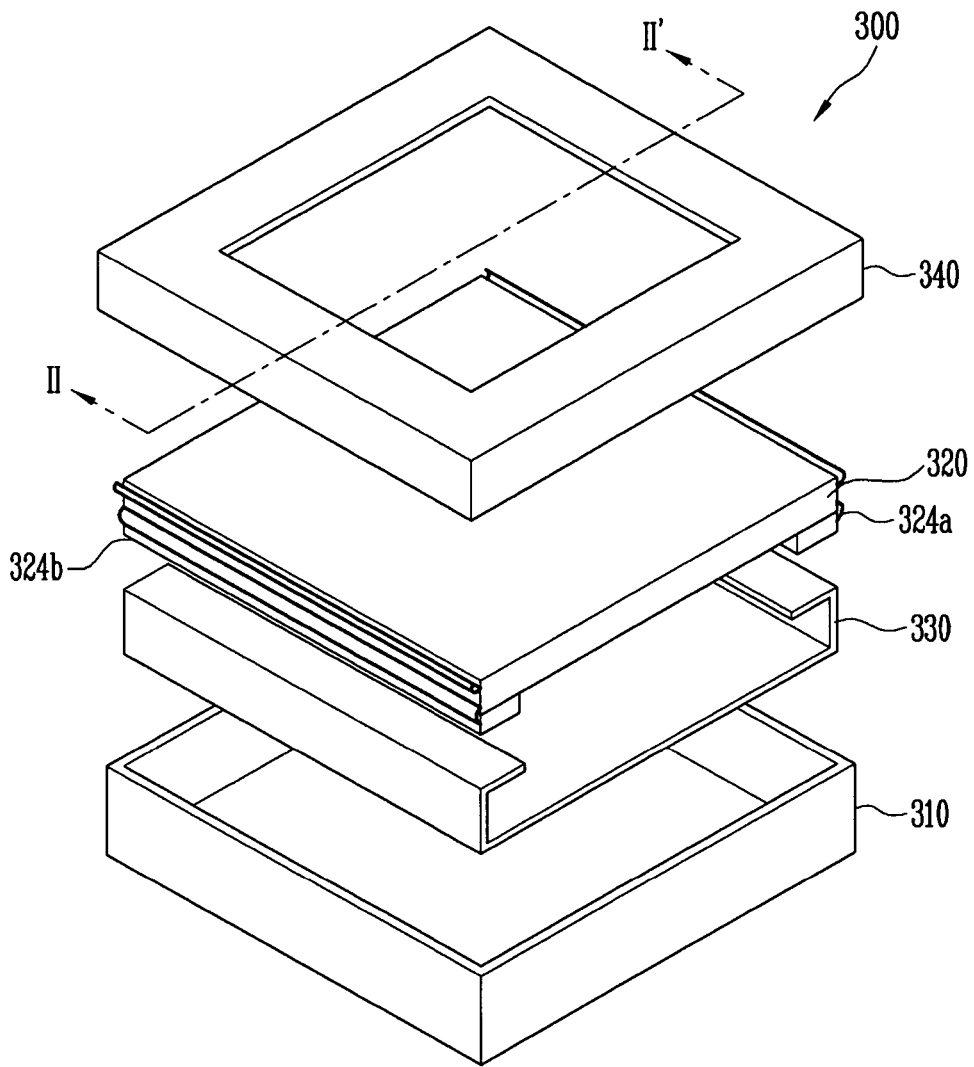
FIG. 3 is an exploded perspective view schematically illustrating a display apparatus with a cooling means according to an exemplary embodiment of the present invention.
Figure 4:
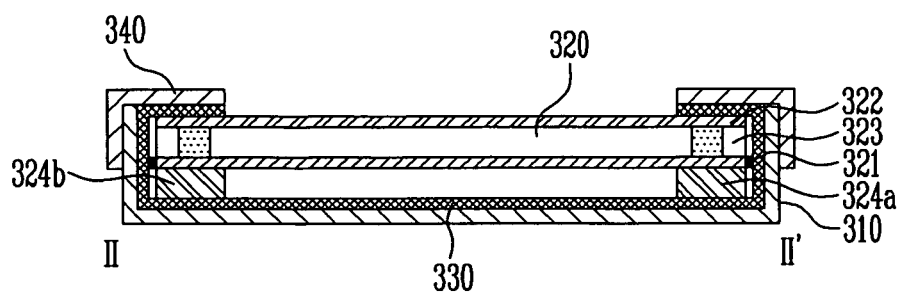
FIG. 4 is a cross-sectional view taken along line II-II' of FIG. 3.

As shown in FIGS. 3 and 4, a display apparatus with a cooling means according to one embodiment of the present invention includes a display panel 320 having a first substrate 321 and a second substrate 322 which are spaced from each other. A chassis member 330 is provided at a rear surface of the display apparatus 300 and is formed to surround sides and a front edge region of the display panel 320.

Further, the display apparatus includes a back cover 310 surrounding and holding the sides of the display panel 320, and a front cover 340 surrounding the front edge region of the display panel 320.

Figure 5:
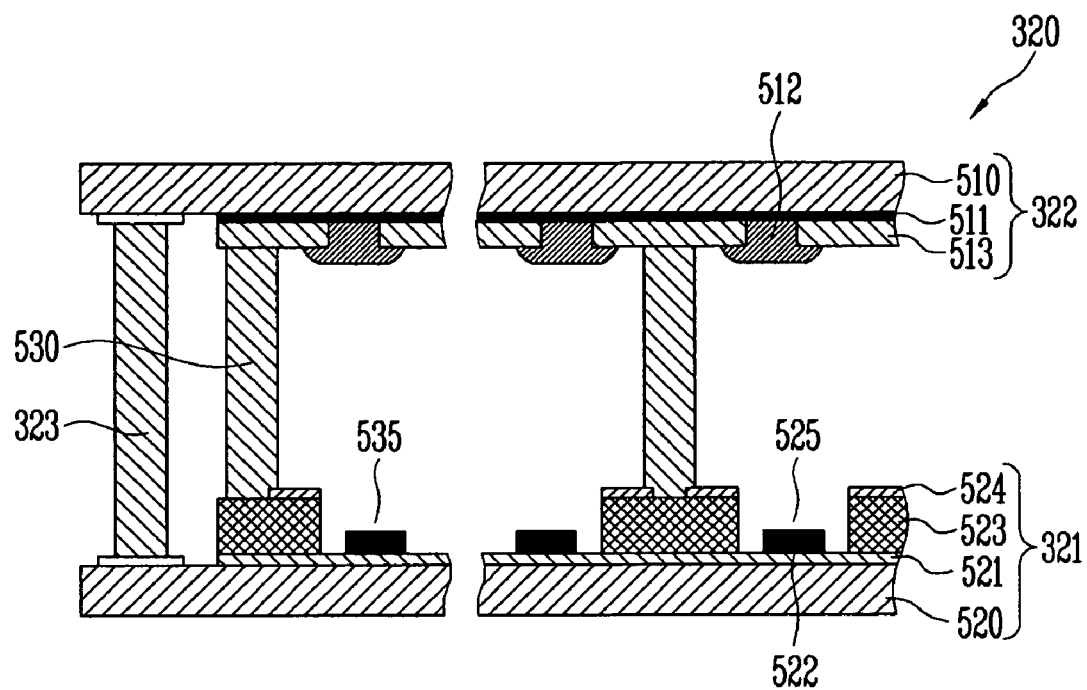
FIG. 5 is a cross-sectional view schematically illustrating the display panel of FIG. 4.

FIG. 5 is a cross-sectional view schematically illustrating portions of the display panel of FIG. 4. However, the display panel is not limited to the structure shown in FIG. 5.

As shown in FIG. 5, the display panel 320 includes a first substrate 321 from which electrons are emitted, and a second substrate 322 on which an image is displayed. The first and second substrates 321, 322 are spaced from each other maintaining a vacuum state. A supporter 323 is provided between the first substrate 321 and the second substrate 322 to support the first and second substrates 321, 322 and maintain the vacuum state.

Further, the display panel 320 is connected to a panel driver (as shown in FIG. 4). The panel driver includes a data driver 324a to supply a data signal and a scan driver 324b to supply a scan signal.

In more detail as seen in FIG. 5, the first substrate 321 includes a transparent substrate 520 and a cathode electrode 521 formed, for example, as a stripe on the transparent substrate 520. Additionally, the first substrate includes a gate electrode 524, the cathode electrode 521 and an emitter 522 provided as an election emission device. The cathode electrode 521 may be made from a transparent material such as indium tin oxide (ITO).

Further, the first substrate 321 includes an insulating layer 523 formed on both the transparent substrate 520 and the cathode electrode 521 and electrically insulating the gate electrode 524 from the cathode electrode 521. The insulating layer 523 is formed with at least one first hole 525 so that the cathode electrode 521 is exposed through the first hole 525.

The gate electrode 524 may be formed as a stripe on the insulating layer 523, and arranged to overlap the cathode electrode 521. The gate electrode 524 supplies a data signal from a data electrode driver or a scan signal from a scan electrode driver to the electron emission device. The gate electrode 524 is formed with at least one second hole 535 corresponding to the first hole 525, thereby exposing the emitter 522.

The second substrate 322 includes a transparent substrate 510, an anode electrode 511 formed on the transparent substrate 510, a fluorescent material 512 formed on the anode electrode 511 to emit light by colliding with the electrons emitted from the emitter 522, and a light-shielding layer 513 formed between the fluorescent materials 512.

In the display panel 320, the supporter 323 seals and supports the first substrate 321 and the second substrate 322, maintaining the vacuum state.

In addition to the supporter 323, a spacer 530 supports the first and second substrates 321, 322 and maintains the vacuum state of a space between the first and second substrate 321 and 322 against the external atmospheric pressure, thereby keeping a uniform distance between the first and second substrates 321 and 322. The spacer 530 has a first end coupled to the light-shielding layer 513 and a second end coupled to the insulating layer 523.

Here, the display panel 320 having a top-gate structure electron emission device is illustrated by way of example, but is not limited to this structure. Alternatively, the electron emission device may have various structures such as a bottom-gate structure, a double-gate structure, etc. as long as it can emit electrons.

In the display panel 320, a positive voltage of an external power source is applied to the cathode electrode 521, a negative voltage is applied to the gate electrode 524, and the positive voltage is applied to the anode electrode 511. The voltage difference between the cathode electrode 521 and the gate electrode 524 generates an electric field so that electrons are emitted. Then, a high voltage applied to the anode electrode 511 guides the emitted electrons to move and collide with the fluorescent material 512 so that the fluorescent material 512 emits light, thereby representing a gradation of an image.

The display panel is connected to a data driver 324a and a scan driver 324b to supply data and scan signals, respectively. The data and scan drivers 324a, 324b are placed on the rear surface of the display panel 320. Heat generated from the data and scan drivers 324a, 324b is transferred to the display panel 320 via the supporter 323, thereby increasing the temperature of the entire display panel 320.

To effectively discharge the heat from the display panel 320, the chassis member 330 is bent having a "⊏"-shape (e.g., a channel shape) to surround the sides and a portion of the front edge region of the display panel 320.

In more detail, the chassis member 330 is made of metals having good thermal conductivity, and is provided adjacent the panel driver (the data driver 324a and the scan driver 324b). The chassis member 330 may be sized to match the display panel 320, and receives heat from the entire display panel 320. That is, the panel driver directly contacts the chassis member 330, so that the heat generated by the panel driver is directly transferred to the chassis member 330, thereby decreasing the heat transferred from the panel driver to the display panel 320.

Further, the chassis member 330 is bent to surround the sides and a portion of the front edge of the display panel 320, thereby discharging the heat from the sides and the front of the display panel 320. The portion of the front edge of the display panel 320 covered by the chassis member may correspond to the positions of the data driver 324a and the scan driver 324b on the first surface of the display panel.

The back cover 310 is provided adjacent the chassis member 330 so that the chassis member 330 and the display panel 320 are stably seated in the back cover 310. The back cover 310 may be made from aluminum, and may be bent to have an "L"-shape to surround the sides of the display panel 320.

Further, the front cover 340 is bent to cover a portion of the sides, and is coupled to the back cover 310, thereby housing the display panel 320.

Figure 6:
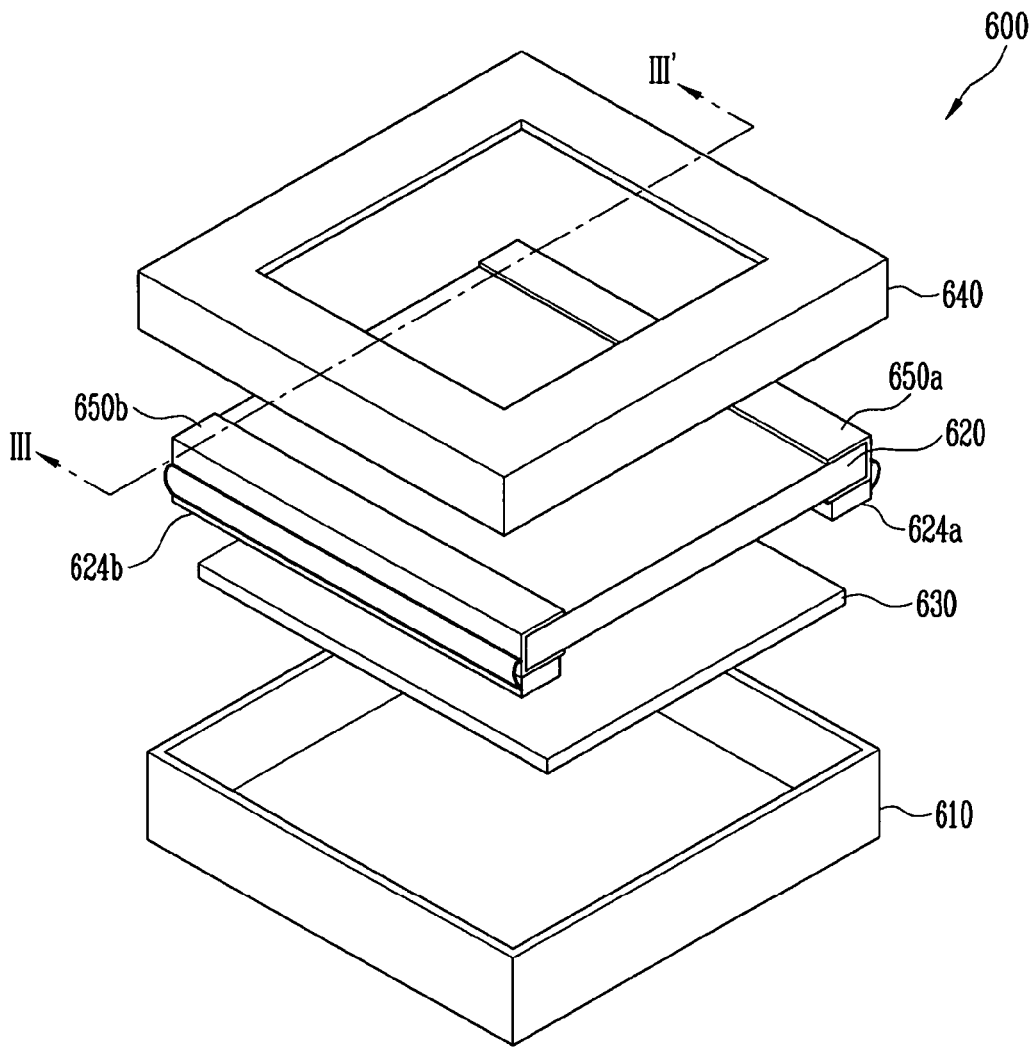
FIG. 6 is an exploded perspective view schematically illustrating a display apparatus with a cooling means according to another exemplary embodiment of the present invention.
Figure 7:
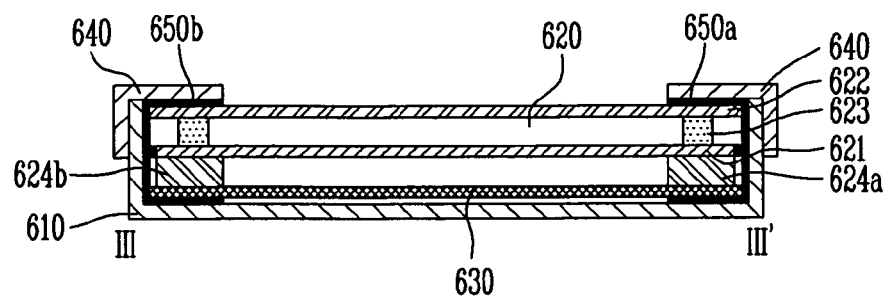
FIG. 7 is a cross-sectional view taken along line III-III' of FIG. 6.

FIG. 6 is an exploded perspective view schematically illustrating a display apparatus with a cooling means according to another exemplary embodiment of the present invention, and FIG. 7 is a cross-sectional view taken along line III-III' of FIG. 6. As shown in FIGS. 6 and 7, the display apparatus 600 with a cooling means according to the present embodiment includes a display panel 620 having a first substrate 621 and a second substrate 622 which are spaced from each other. The display apparatus 600 also includes a chassis member 630 provided at the rear of the display apparatus 600; and a conductive member 650a, 650b provided on sides and a portion of the front edge region of the display panel 620.

Further, the display apparatus 600 includes a back cover 610 surrounding the rear of the display apparatus and holding 600 and the sides of the display panel 620, and a front cover 640 surrounding a portion of the front edge region of the display panel 620.

Also, the display panel 620 is connected with a panel driver. The panel driver includes a data driver 624a to supply a data signal and a scan driver 624b to supply a scan signal.

Descriptions of the same components of the previous embodiments will be omitted to the extent that they have already been described.

The conductive members 650a, 650b are placed on both a first surface of the chassis member 630, corresponding to the panel driver 624a, 624b and a front edge region of the display panel 620. Here, the conductive member 650a, 650b is integrally formed to have a "⊂"-shape, covering the side of the display panel 620. In one exemplary embodiment, the conductive member 650a, 650b is flexible enough to easily contact the display panel 620. For example, the conductive members 650a, 650b are formed from conductive tape to easily contact the display panel 620. The conductive member 650a, 650b is made of metal having good thermal conductivity.

The chassis member 630 is in contact with the conductive materials 650a, 650b and the panel driver 624a, 624b, thereby discharging heat from the panel driver 624a, 624b.

Figure 8:
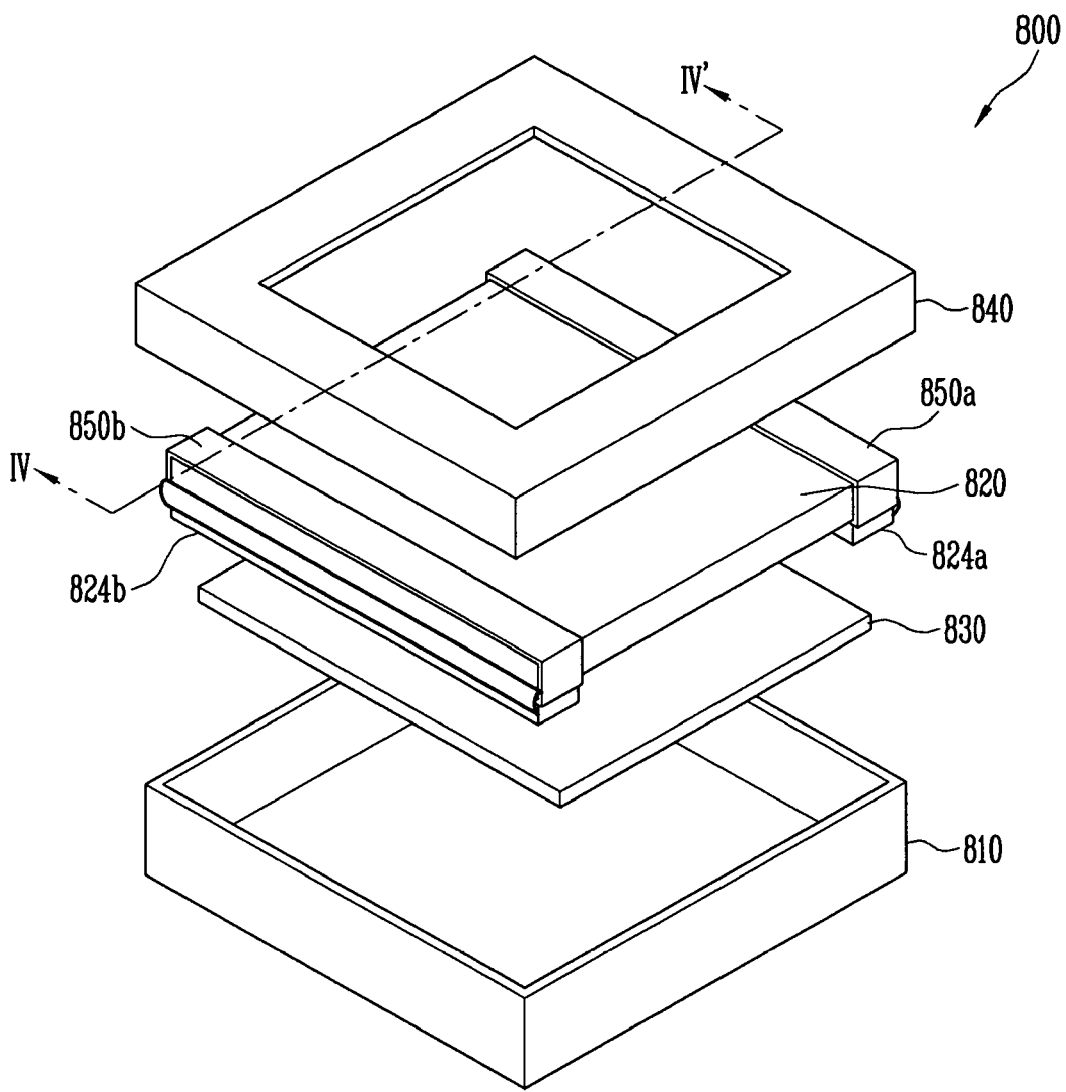
FIG. 8 is an exploded perspective view schematically illustrating a display apparatus with a cooling means according to yet another exemplary embodiment of the present invention.
Figure 9:
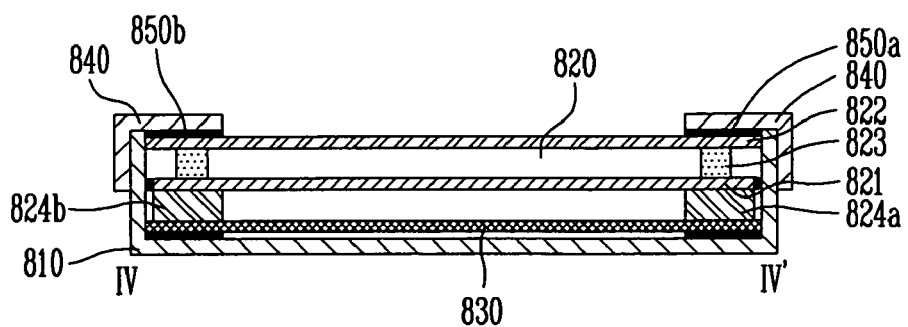
FIG. 9 is a cross-sectional view taken along line IV-IV' of FIG. 8.

FIG. 8 is an exploded perspective view schematically illustrating a display apparatus with a cooling means according to yet another embodiment of the present invention, and FIG. 9 is a cross-sectional view taken along line IV-IV' of FIG. 8. As shown in FIGS. 8 and 9, the display apparatus 800 with a cooling means according to the present embodiment includes a display panel 820 having a first substrate 821 and a second substrate 822 which are spaced from each other. The display apparatus also includes a chassis member 830 provided at the rear of the display apparatus 800 and conductive members 850a, 850b provided to contact edges of the display panel 820 and a front surface of the chassis member 830.

Further, the display apparatus 800 includes a back cover 810 surrounding the rear of the display apparatus 800 and holding the sides of the display panel 820, and a front cover 840 surrounding the front edge region of the display panel 820.

Also, the display panel 820 is connected with a panel driver. The panel driver includes a data driver 824a to supply a data signal and a scan driver 824b to supply a scan signal.

As before, descriptions of common components of the previous embodiments will be omitted to the extent that they have already been described.

The conductive member 850a, 850b are attached to encircle the display panel 820 in the direction of the panel driver adjacent first and second edges of the display panel. In one exemplary, the conductive members 850a, 850b are flexible enough to easily contact the display panel 820. For example, the conductive member 850a, 850b is formed from conductive tape to easily contact the display panel 820. The conductive members 850a, 850b may be made from metal having good thermal conductivity.

The chassis member 830 is in contact with the conductive materials 850a, 850b and the panel driver 824a, 824b, thereby discharging heat from the panel driver 824a, 824b. In one exemplary embodiment, the conductive member has a □-shape (e.g., a rectangular tube) to contact a portion of the display panel first surface As described above, the present invention provides a display apparatus with a cooling means in which heat is effectively discharged from the entire display panel.

While the invention has been described in connection with certain exemplary embodiments, it is to be understood by those skilled in the art that the invention is not limited to the disclosed embodiments, but, on the contrary, is intended to cover various modifications included within the sprit and scope of the appended claims and equivalents thereof.

What is claimed is:

1. A display apparatus having cooling means, comprising:
   a display panel comprising a first substrate and a second substrate spaced from each other;
   a back cover surrounding sides and covering a rear side of the display panel;
   a front cover surrounding a front edge region of the display panel;
   a chassis between the back cover and the front cover and comprising a plate at the rear side of the display panel, a side portion extending from the plate toward a front side of the display panel, and a flange extending parallel to the substrates from the side portion to cover a portion of the front side of the display panel; and
   a data driver and a scan driver for supplying signals to the display panel and located between the display panel and the chassis, wherein the flange substantially overlaps with the data driver and the scan driver,
   wherein the chassis comprises a conductive metal portion substantially entirely covering the rear side of the display panel.

2. The display apparatus according to claim 1, wherein the data driver and the scan driver are at the rear side of the display panel.

3. The display apparatus according to claim 1, further comprising:
   an emitter on the first substrate, between the first substrate and the second substrate; and
   a supporter for maintaining a vacuum between the first substrate and the second substrate,
   wherein the second substrate is adapted to display an image using electrons emitted from the emitter.

4. The display apparatus according to claim 1, wherein the chassis has a channel-shaped cross-section.

5. The display apparatus according to claim 1, wherein the data driver and the scan driver are adjacent to the chassis.

* * * * *